(12) United States Patent
Walter et al.

(10) Patent No.: US 9,324,631 B2
(45) Date of Patent: Apr. 26, 2016

(54) SEMICONDUCTOR DEVICE INCLUDING A STRESS BUFFER MATERIAL FORMED ABOVE A LOW-K METALLIZATION SYSTEM

(71) Applicant: GLOBALFOUNDRIES Inc., Grand Cayman (KY)

(72) Inventors: Axel Walter, Radebeul (DE); Matthias Lehr, Dresden (DE)

(73) Assignee: GLOBALFOUNDIRES Inc., Grand Cayman (KY)

( * ) Notice: Subject to any disclaimer, the term of this patent is extended or adjusted under 35 U.S.C. 154(b) by 43 days.

(21) Appl. No.: 13/870,411

(22) Filed: Apr. 25, 2013

(65) Prior Publication Data

US 2013/0234300 A1    Sep. 12, 2013

Related U.S. Application Data

(62) Division of application No. 12/839,026, filed on Jul. 19, 2010, now Pat. No. 8,450,206.

(30) Foreign Application Priority Data

Jul. 31, 2009   (DE) .......................... 10 2009 035 437

(51) Int. Cl.
*H01L 23/58*   (2006.01)
*H01L 23/48*   (2006.01)
(Continued)

(52) U.S. Cl.
CPC .......... *H01L 23/481* (2013.01); *H01L 23/5283* (2013.01); *H01L 23/53238* (2013.01);
(Continued)

(58) Field of Classification Search
CPC .............. H01L 23/481; H01L 23/5283; H01L 23/53238; H01L 23/562; H01L 24/03; H01L 24/05; H01L 24/12; H01L 2224/03; H01L 2224/0401; H01L 2224/05018; H01L 2224/05022; H01L 2224/05147; H01L 2224/05541; H01L 2224/05548; H01L 2224/05554
USPC .......................... 257/632, 758–762, 772–779
See application file for complete search history.

(56) References Cited

U.S. PATENT DOCUMENTS 6,462,426 B1   10/2002   Kelkar et al. .................. 257/781
6,528,881 B1    3/2003   Tsuboi .......................... 256/738
(Continued)

FOREIGN PATENT DOCUMENTS

JP    2005-268442 A    9/2005    .............. H01L 21/60
TW    200837855        9/2008

OTHER PUBLICATIONS

Translation of Official Communication from German Patent Office for German Patent Application No. 10 2009 035 437.9 dated Apr. 20, 2010.
(Continued)

*Primary Examiner* — Thanh T Nguyen
(74) *Attorney, Agent, or Firm* — Amerson Law Firm, PLLC (57) ABSTRACT

A bump structure or pillar structure formed above a metallization system of a complex semiconductor device may include a stress buffer layer, which may efficiently distribute the resulting mechanical stress which may typically occur during the chip package interaction due to a thermal mismatch of these components. The stress buffer layer comprises copper-based buffer regions that cover a significant portion of the overall surface, wherein a thickness of approximately 3-10 μm may also be used. Moreover, the buffer regions may efficiently replace aluminum as a terminal metal active region.

22 Claims, 6 Drawing Sheets

(51) Int. Cl.
*H01L 23/528* (2006.01)
*H01L 23/532* (2006.01)
*H01L 23/00* (2006.01)
H01L 23/31 (2006.01)
H01L 23/367 (2006.01)
H01L 23/552 (2006.01)

(52) U.S. Cl.
CPC .............. *H01L23/562* (2013.01); *H01L 24/03* (2013.01); *H01L 24/05* (2013.01); *H01L 24/12* (2013.01); *H01L 23/3114* (2013.01); *H01L 23/3192* (2013.01); *H01L 23/3677* (2013.01); *H01L 23/552* (2013.01); *H01L 24/11* (2013.01); *H01L 24/13* (2013.01); *H01L 2224/03* (2013.01); *H01L 2224/0401* (2013.01); *H01L 2224/05018* (2013.01); *H01L 2224/05022* (2013.01); *H01L 2224/0558* (2013.01); *H01L 2224/05147* (2013.01); *H01L 2224/05541* (2013.01); *H01L 2224/05548* (2013.01); *H01L 2224/05554* (2013.01); *H01L 2224/05558* (2013.01); *H01L 2224/05567* (2013.01); *H01L 2224/05572* (2013.01); *H01L 2224/05639* (2013.01); *H01L 2224/05647* (2013.01); *H01L 2224/06133* (2013.01); *H01L 2224/1148* (2013.01); *H01L 2224/131* (2013.01); *H01L 2224/13007* (2013.01); *H01L 2224/13022* (2013.01); *H01L 2224/13147* (2013.01); *H01L 2224/81191* (2013.01); *H01L 2924/0002* (2013.01); *H01L 2924/00013* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01019* (2013.01); *H01L 2924/01022* (2013.01); *H01L 2924/01024* (2013.01); *H01L 2924/01029* (2013.01); *H01L 2924/01032* (2013.01); *H01L 2924/01033* (2013.01); *H01L 2924/01047* (2013.01); *H01L 2924/01073* (2013.01); *H01L 2924/01074* (2013.01); *H01L 2924/01079* (2013.01); *H01L 2924/01082* (2013.01); *H01L 2924/01327* (2013.01); *H01L 2924/04941* (2013.01); *H01L 2924/04953* (2013.01); *H01L 2924/05042* (2013.01); *H01L 2924/10253* (2013.01); *H01L 2924/1306* (2013.01); *H01L 2924/14* (2013.01); *H01L 2924/1433* (2013.01); *H01L 2924/19041* (2013.01); *H01L 2924/19043* (2013.01); *H01L 2924/3025* (2013.01); *H01L 2924/30105* (2013.01)

(56) References Cited

U.S. PATENT DOCUMENTS

| 6,656,828 | B1* | 12/2003 | Maitani et al. | 438/613 |
|---|---|---|---|---|
| 6,943,440 | B2 | 9/2005 | Kim et al. | 257/690 |
| 2005/0082685 | A1 | 4/2005 | Bojkov et al. | |
| 2005/0127530 | A1 | 6/2005 | Fan et al. | 257/786 |
| 2006/0273463 | A1 | 12/2006 | Wakabayasi et al. | 257/773 |
| 2006/0292851 | A1* | 12/2006 | Lin et al. | 438/618 |
| 2007/0164441 | A1* | 7/2007 | Lee et al. | 257/762 |
| 2007/0176292 | A1 | 8/2007 | Chen et al. | 257/750 |
| 2008/0036086 | A1 | 2/2008 | Ishio | 257/738 |
| 2008/0042273 | A1 | 2/2008 | Lin | |
| 2008/0042280 | A1* | 2/2008 | Lin et al. | 257/751 |
| 2008/0146018 | A1* | 6/2008 | Lin et al. | 438/618 |
| 2010/0244263 | A1 | 9/2010 | Lin et al. | 257/758 |

OTHER PUBLICATIONS

International Search Report from PCT/IB2010/053457 dated May 25, 2011.
International Preliminary Report on Patentability from PCT/IB2010/053457 dated Feb. 9, 2012.
Office Action dated Mar. 20, 2014 from Chinese Intellectual Property Office for CN Application No. 201080038650.5, 13 pages.
Examination Report dated Feb. 13, 2015 from Taiwan Intellectual Property Office for TW Application No. 099125274, 10 pages.
Office Action dated May 20, 2015 from Chinese Intellectual Property Office for CN Application No. 201080038650.5, 16 pages total including translation.

* cited by examiner

SEMICONDUCTOR DEVICE INCLUDING A STRESS BUFFER MATERIAL FORMED ABOVE A LOW-K METALLIZATION SYSTEM

CROSS-REFERENCE TO RELATED APPLICATIONS

This is a divisional of co-pending application Ser. No. 12/839,026, filed Jul. 19, 2010, which claimed priority from German Patent Application No. 10 2009 035 437.9, filed Jul. 31, 2009.

BACKGROUND OF THE INVENTION

1. Field of the Invention

Generally, the present disclosure relates to integrated circuits, and, more particularly, to the techniques for reducing chip-package interactions caused by thermal mismatch between the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the feature sizes of circuit elements are steadily scaled down. Due to this ongoing demand for shrinking the feature sizes of highly sophisticated semiconductor devices, copper, in combination with a low-k dielectric material, has become a frequently used alternative in the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to implement the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased in combination with a reduced conductivity of the lines due to a reduced cross-sectional area. For this reason, traditional dielectrics, such as silicon dioxide (k>4) and silicon nitride (k>7), are replaced by dielectric materials having a lower permittivity, which are, therefore, also referred to as low-k dielectrics having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of these sensitive dielectric materials and their adhesion to other materials.

In addition to the problems of reduced mechanical stabilities of advanced dielectric materials having a dielectric constant of 3.0 and significantly less, device reliability may be affected by these materials during operation of sophisticated semiconductor devices due to an interaction between the chip and the package caused by a thermal mismatch of the corresponding thermal expansion of the different materials. For instance, in the fabrication of complex integrated circuits, increasingly, a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, for instance, using aluminum as a terminal metal in combination with a solder material which may be brought into contact with respective contact pads of the package. Thus, after reflowing the bump material, a reliable electrical and mechanical connection may be established between the terminal metal formed on the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities, which may be required for complex integrated circuits, such as CPUs, storage memories and the like. During the corresponding process sequence for connecting the bump structure with a package carrier, a certain degree of pressure and/or heat may be applied to the composite device so as to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects in the form of cracks, delamination and the like, due to reduced mechanical stability and adhesion to other materials.

Moreover, during operation of the finished semiconductor device attached to a corresponding package substrate, significant mechanical stress may occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which typically may exhibit a different thermal conductivity and a coefficient of thermal expansion compared to the silicon chip.

Figure 1A:
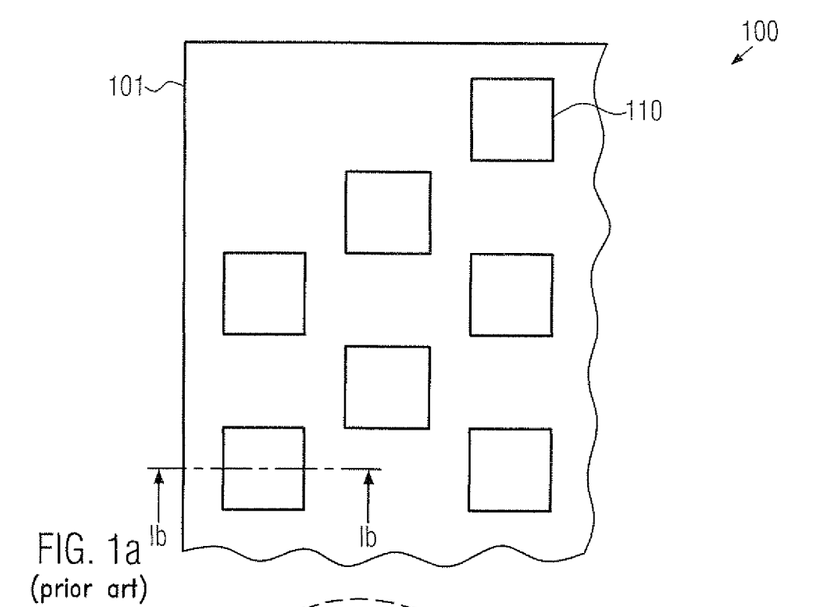
FIG. 1a schematically illustrates a top view of a semiconductor device having a solder bump structure formed thereon, in accordance with a desired layout.
Figure 1B:
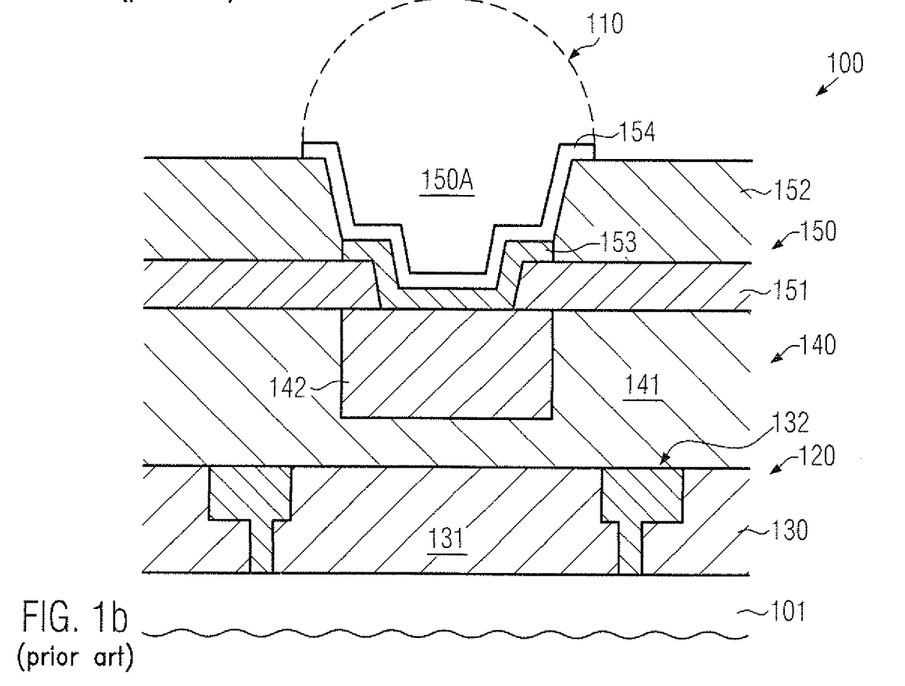
FIG. 1b schematically illustrates a cross-sectional view of a conventional semiconductor device including a sophisticated metallization system and a bump structure based on aluminum as a terminal metal and a lead-containing solder material.

With reference to FIGS. 1a-1b, a typical conventional configuration of a semiconductor device including a solder bump structure will now be described in more detail.

FIG. 1a schematically illustrates a top view of the configuration or layout of a semiconductor device 100 in which the mechanical and electrical connection between a package and the device 100, i.e., a specific chip or die 101, is to be established on the basis of a solder bump structure. For this purpose, an appropriate distribution of contact elements 110 across the entire area of the die 101 may be provided, wherein, as previously discussed, nearly the entire area of the die 101 is available for appropriately positioning the contact elements 110. In this manner, a very complex contact structure may be accomplished, wherein each of the contact elements 110 may be connected to a counterpart contact pad or bump of a corresponding package substrate during a single manufacturing process, contrary to corresponding wire bond techniques in which a bond wire may have to be connected to bond pads of the chip and the package in a substantially sequential manner.

FIG. 1b schematically illustrates a cross-sectional view of the device 100 according to the line Ib in FIG. 1a. As illustrated, the device 100 comprises the die or chip 101, which may be understood as the basic substrate for forming thereabove circuit elements and the like. The substrate 101 is typically provided in the form of an insulating substrate, a semiconductor material and the like. It should be appreciated that, in and above the substrate 101, typically, a plurality of circuit elements, such as transistors, capacitors, resistors and the like, are provided in accordance with the circuit function to be implemented in the device 100. For convenience, any such circuit elements, which may include elements with critical dimensions of 50 nm and less in sophisticated devices, are not shown in FIG. 1b. As discussed above, due to the complex layout of electronic circuits implemented in the semiconductor device 100, a complex metallization system 120 is typically required, which may comprise a plurality of metallization layers stacked on top of each other, wherein, for convenience, a metallization layer 130 and a metallization layer 140 are depicted. For instance, the metallization layer 130 may be comprised of a dielectric material 131, such as a low-k dielectric material, a ULK material and the like, in which metal lines and vias 132 are embedded that are typically comprised of copper, in combination with appropriate conductive barrier materials, to provide reliable copper confinement. It should be appreciated that each metallization layer of the system 120 may not necessarily comprise a sensitive low-k dielectric material since different metallization levels may require different performance characteristics, for instance with respect to drive current capability and signal propagation delay. However, at any rate, typically, a plurality of metallization layers may comprise a sensitive low-k dielectric material, thereby reducing the overall mechanical stability, as discussed above. Furthermore, the metallization layer 140 represents the "last" metallization layer and comprises any appropriate dielectric material 141 including metal regions 142, which may represent contact pads for connecting to a contact structure or bump structure 150, which may actually represent the interface for connecting the device 100 with a package substrate (not shown). The contact or bump structure 150 typically comprises a passivation layer 151, which may thus "passivate" the metallization system 120, wherein, typically, a plurality of dielectric materials, such as silicon dioxide, silicon oxynitride, silicon nitride, are used to provide the desired characteristics in view of chemical and mechanical stability. Moreover, a further dielectric material, such as a polyimide 152, is formed on the passivation material 151. The materials 151 and 152 are patterned in such as way that an opening 150A is aligned to at least a portion of the contact pad 142 of the last metallization layer 140. As explained before, in sophisticated metallization systems, such as the system 120, copper is preferably used, which, however, may not be compatible with well-established process techniques and materials as have been used in complex metallization systems formed on the basis of aluminum. For this reason, frequently, a further metal material 153, which is also referred to as a terminal metal, in the form of aluminum, is provided to act as an interface between the sensitive copper material of the pad 142 and the contact element 110. In this manner, well-established materials and techniques may be applied for forming the contact element 110, for instance by providing efficient underbump metallization systems 154, for instance based on chromium, copper, tungsten and the like.

On the other hand, providing aluminum as the terminal metal 153 may require additional resources for depositing, patterning and cleaning the device 100 prior to actually forming the contact element 110. That is, after forming the metallization system 120 on the basis of well-established process techniques, the passivation material 151 is deposited and patterned, followed by the deposition of the aluminum material, which may be associated by the deposition of an appropriate barrier material, such as titanium, titanium nitride and the like. Thereafter, a complex patterning process is to be applied, for instance, by applying an etch chemistry on the basis of bromine and the like. Consequently, corresponding precursor materials and deposition and etch tools are required for providing the terminal metal 153. Thereafter, a well-established process sequence is applied for depositing the polyimide material 152 and patterning the same, followed by the deposition of the underbump materials 154. Thereafter, a deposition mask is typically applied and a solder bump material in the form of a lead-containing material is deposited on the basis of electroplating techniques, followed by the removal of the deposition mask and the patterning of the underbump material 154. After separating the semiconductor device 100 into individual chips 101, a connection to an appropriate package substrate may be accomplished by mechanically coupling the device 100 and the package substrate and reflowing the contact element 110, thereby obtaining the desired intermetallic connection between the element 110 and the corresponding contact pad of the package substrate, which may also comprise a solder bump, depending on the overall process strategy. Finally, any appropriate fill material may be provided between the chip 101, i.e., the contact structure 150 and the package substrate, so as to enhance mechanical, chemical and thermal stability of the composite device.

As discussed above, during the formation of the device 100, during the process of connecting the device 100 with a package substrate, and finally during operation of the composite semiconductor device, significant mechanical stress may be applied to the metallization system 120 via the contact structure 150, i.e., via the contact elements 110, wherein a certain degree of resilience of the contact elements 110, i.e., the lead-containing solder material, may result in a certain degree of "buffer effect."

However, upon introducing so-called lead-free solder materials, for instance in view of environmental regulations and the like, and also in an attempt to further improve the thermal and electrical performance of the contact structure 150, for instance by providing copper pillars instead of the contact elements 110, the mechanical stress in the metallization system 120 may be even further enhanced since, typically, these materials may exhibit a lesser degree of resilience, thereby transferring significantly increased shear forces into the last metallization layer 140.

Consequently, in many conventional approaches, the increase of the mechanical stress in the metallization system 120 may require the usage of dielectric materials of superior mechanical stability, thereby, however, typically increasing the dielectric constant and thus reducing the overall electrical performance of the metallization system 120.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In general, the present disclosure provides semiconductor devices and manufacturing techniques in which the mechanical stress transferred via a contact structure formed on the basis of a lead-free material into a metallization system of a complex integrated circuit may be accommodated or "buffered" by providing a buffer layer, which may include "thick" buffer regions of increased lateral dimension on which corresponding solder bumps or metal pillars are to be formed. In this manner, mechanical stress caused during the process of connecting a semiconductor chip to a package substrate and during the operation of the composite semiconductor device may be efficiently distributed substantially across the entire surface area of the chip without requiring specific modifications in the metallization system, for instance, by reducing the amount of low-k dielectric material provided therein. In some illustrative aspects disclosed herein, the buffer layer may be formed on the basis of a copper material without using aluminum, thereby avoiding the requirement for any resources as may typically be necessary when using aluminum as a terminal metal. For this purpose, the buffer region may be formed so as to be in contact with respective contact pads of the last metallization layer of the metallization system, wherein the increased lateral and vertical dimensions of the copper contact region may provide the desired mechanical response to any thermal mismatch between the semiconductor chip and the chip package.

One illustrative semiconductor device disclosed herein comprises a metallization system formed above a substrate, wherein the metallization system comprises a plurality of metallization layers, at least some of which comprise a low-k dielectric material. The semiconductor device further comprises a stress buffer layer formed above a last metallization layer of the metallization system, wherein the stress buffer layer comprises a copper-containing buffer region that connects to a copper-containing contact pad provided in the last metallization layer of the metallization system. The device further comprises a lead-free contact element formed on a portion of the copper-containing buffer region, wherein a lateral width of the buffer region is greater than a lateral width of the lead-free contact element. Moreover, the device comprises a package substrate connected to the metallization system via the lead-free contact element.

Another illustrative embodiment disclosed herein is a semiconductor device that includes a metallization system positioned above a substrate, the metallization system having a plurality of metallization layers, at least some of the metallization layers including a low-k dielectric material. The semiconductor device further includes a passivation layer positioned above a last metallization layer of the metallization system, the last metallization layer including a plurality of contact pads. Furthermore, a stress buffer layer is positioned above the passivation layer, the stress buffer layer including a plurality of stress buffer regions, each of the plurality of stress buffer regions having a contact portion extending through the passivation layer and conductively contacting a respective one of the plurality of contact pads. The illustrative semiconductor device also includes, among other things, a dielectric material layer positioned above the stress buffer layer, and a plurality of contact elements positioned in and above the dielectric material layer, each of the plurality of contact elements extending through the dielectric material layer and conductively contacting a respective one of the plurality of stress buffer regions, wherein a lateral width of at least one of the plurality of contact elements is less than a lateral width of the respective one of the plurality of stress buffer regions conductively connected thereto.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which complex metallization systems including sensitive low-k dielectric materials may receive a bump structure or pillar structure formed on the basis of a lead-free material, wherein mechanical stress may be reduced by providing an appropriate buffer layer including laterally isolated metal buffer regions with moderately great dimensions in the "vertical" and lateral direction. Consequently, the resulting mechanical stress may be accommodated by a large volume provided in the stress buffer layer and may also be distributed across substantially the entire chip surface.

In this respect, it should be appreciated that a lead-free material is to be understood as any material composition in which lead may not be included in the stoichiometric composition of the material, so that any minute amounts of lead, which may unintentionally be incorporated into the material under consideration, may be less than approximately 0.5 atomic percent with respect to the entire material composition. For example, lead-free solder materials may be provided in the form of a tin and further mixture, a tin/silver/copper mixture and the like, while any lead impurity may be less than specified above. Similarly, a copper material may also be referred to as a lead-free material if a degree of purity with respect to lead impurities may be less than specified above.

In some illustrative embodiments, the metallization system in combination with a contact structure may be provided without using aluminum, thereby providing superior electrical performance of the metallization system while additionally avoiding resources required for forming and patterning an aluminum material. Hence, superior efficiency of the overall process flow may be accomplished, while a desired high level of electrical performance of the metallization system may also be achieved, since the mechanical stress caused by the interaction between chip and package may be efficiently reduced within the sensitive metallization system.

With reference to FIGS. 2a-2i, further illustrative embodiments will now be described in more detail, wherein reference may also be made to FIGS. 1a-1b, if necessary.

Figure 2A:
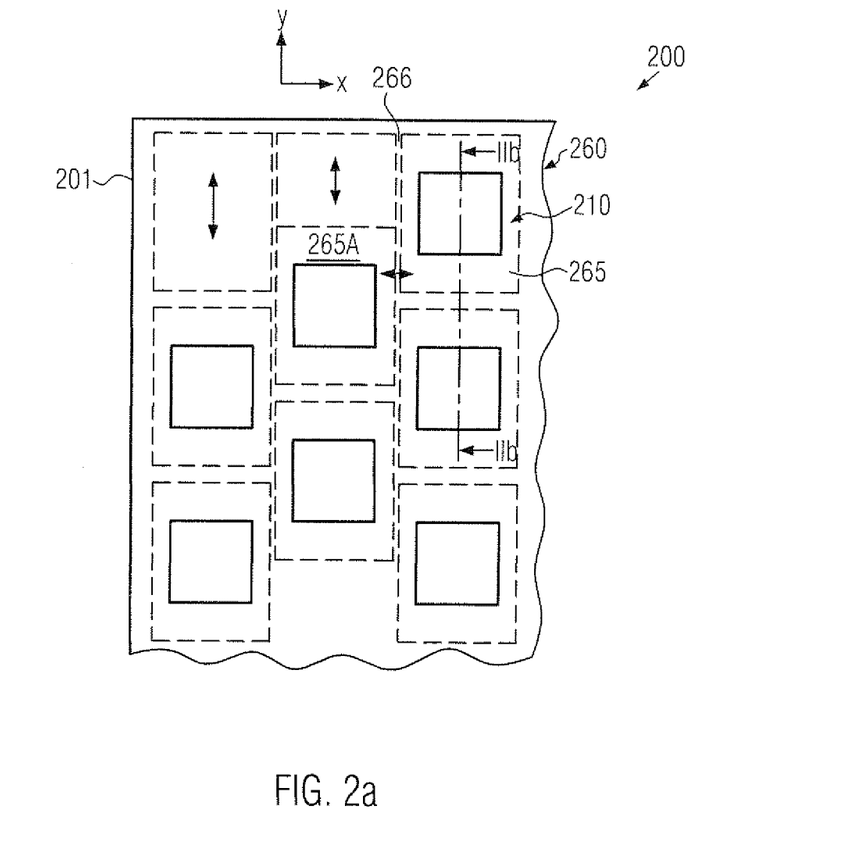
FIG. 2a schematically illustrates a top view of a semiconductor device including a contact structure for connecting to a package substrate, wherein a desired layout within copper-containing buffer regions of increased lateral dimensions may be provided in order to reduce the mechanical stress transferred into a lower lying metallization system, according to illustrative embodiments.

FIG. 2a schematically illustrates a top view of a portion of a semiconductor device 200 wherein, for convenience, a single die region 201 or substrate portion in combination with a corresponding configuration of contact elements, such as solder bump elements, metal pillars and the like, is illustrated. For convenience, the basic layout of the contact elements 210 may be selected to be the same as in the conventional device 100, as previously described with reference to FIGS. 1a and 1b. Moreover, the device 200 may comprise a stress buffer layer 260 in which a plurality of buffer regions 265 may be provided in the form of metal regions, wherein the lateral size, i.e., the surface area, of the buffer regions may be greater compared to the lateral size of the contact elements 210. For example, in some illustrative embodiments, the surface area of the buffer regions 265 may be at least twice the surface area of the contact elements 210. In this manner, any mechanical stress component transferred via the contact elements 210 may be efficiently accommodated by the stress buffer layer 260 and may be distributed across a large area of the entire chip or die 201. For example, the lateral size of the buffer regions 265 may be regular for each of the contact elements 210, while, in other cases, the buffer regions 265 may be adapted in lateral size to the specific position of a contact element within the die 201. For instance, as illustrated for a buffer region 265A, a lateral extension in one direction, indicated as Y, may be increased so as to cover an increased surface portion of the die. On the other hand, the lateral extension in the X direction may be restricted by a desired minimum isolation distance between neighboring contact regions 265. For instance, a lateral offset between two neighboring contact regions, such as the regions 265, 265A, may be selected to be approximately 5 μm or less, such as 1 μm and less, thereby providing very efficient coverage of the surface area of the die 201 by the buffer regions 265. As will be explained later on in more detail, any isolation trenches 266 may be filled with an appropriate dielectric material, such as silicon nitride, polyimide and the like.

Figure 2B:
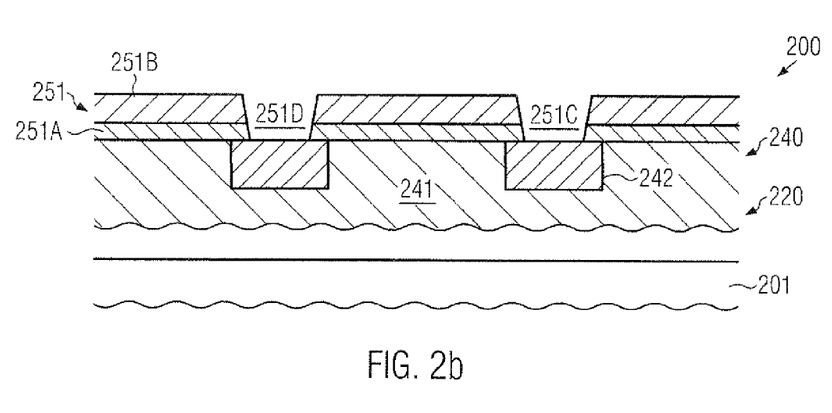
FIGS. 2b-2i schematically illustrate cross-sectional views of the semiconductor device of FIG. 2a during various manufacturing stages in forming a contact structure and connecting the same to a package substrate, according to further illustrative embodiments.

FIG. 2b schematically illustrates a cross-sectional view of the device 200 along the section IIb of FIG. 2a. As illustrated, the device 200 may comprise a substrate, which may also be referred to a basic chip or die material 201, in and above which may be formed any circuit elements as required. Furthermore, a metallization system 220 may be formed above the substrate 201 and may comprise a plurality of stacked metallization layers, as is, for instance, previously described with reference to the metallization system 120 of the device 100 when referring to the metallization layers 130 and 140 (see FIG. 1b). It should be appreciated that the metallization system 220 may have any appropriate configuration, wherein, however, a corresponding adaptation with respect to reducing the amount of low-k dielectric material may not be required when forming the contact elements 210 (FIG. 2a) on the basis of a lead-free material. For convenience, only the last metallization layer 240 of the metallization system is illustrated in FIG. 2b, which may comprise any appropriate dielectric material 241 and metal regions 242 comprised of any appropriate highly conductive metal, such as copper, silver and the like, possibly in combination with any appropriate conductive barrier material, such as tantalum, tantalum nitride and the like. It should be appreciated that the metal regions 242 are shown in FIG. 2b so as to represent corresponding contact pads for connecting to the contact elements 210 (FIG. 2a) still to be formed. Moreover, a passivation layer 251, which may be provided in the form of a layer stack including material layers 251A, 251B, may be formed on the metallization layer 240 and may comprise openings 251C, 251D so as to expose a portion of the contact pads 242. The dielectric materials 251A, 251B and any other material layers may be formed so as to comply with the requirements in view of passivating the layer 240. For example, silicon nitride may be used for the layer 251A, followed by a silicon oxide or silicon oxynitride material, while in other cases a different composition of the layer stack 251 may be applied.

The semiconductor device 200 as shown in FIG. 2b may be formed on the basis of any appropriate manufacturing technique for forming circuit elements and for forming the metallization system 220 having the desired reduced overall signal propagation delay, as is also previously described with reference to the semiconductor device 100. Hence, after providing the last metallization layer 240, the passivation layer 251 may be formed on the basis of any appropriate deposition technique, followed by a lithography process for forming an etch mask (not shown) and patterning the layer 251 by using well-established etch recipes.

Figure 2C:
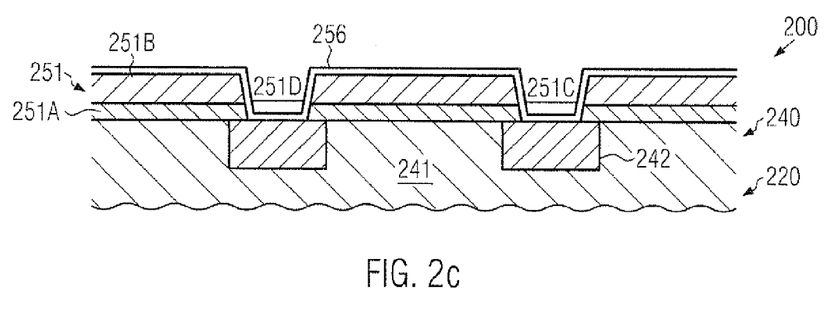

FIG. 2c schematically illustrates the semiconductor device 200 in a further advanced manufacturing stage in which a barrier layer 256 may be formed above the passivation layer 251 and within the openings 251C, 251D. The layer 256 may have any appropriate material composition in order to provide a desired degree of adhesion of a metal still to be formed above the passivation layer 251 and also to provide the desired electrical characteristics, such as conductivity, to the contact pads 242. Furthermore, in some illustrative embodiments, the layer 256 may also act as a current distribution layer during an electrochemical deposition of a metal of the buffer regions 265 (FIG. 2a) still to be formed. For instance, copper, in combination with other materials, such as chromium, tantalum, tungsten and the like, may be efficiently used. Since any of these materials may typically be used during semiconductor production, corresponding deposition tools and precursor materials are readily available. The barrier layer 256 may be provided with a thickness of approximately 50 to several hundred nanometers, depending on the overall device requirements.

Figure 2D:
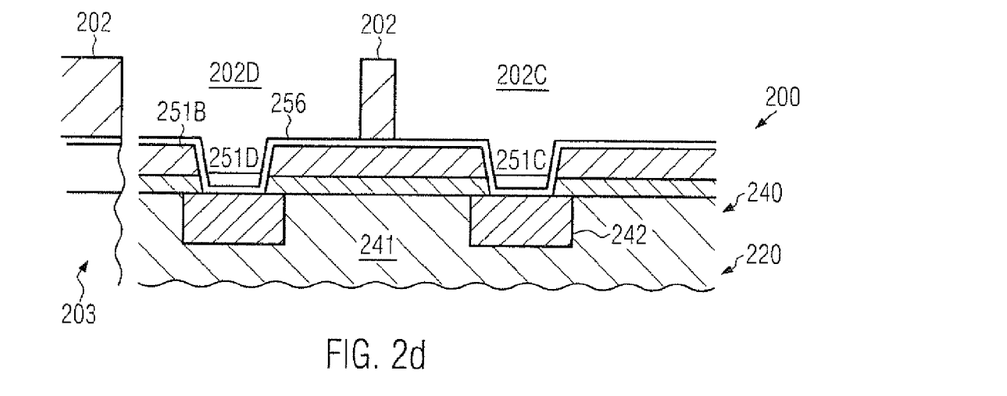

FIG. 2d schematically illustrates the device 200 with a deposition mask 202, such as a resist mask, which may define the lateral size of the buffer regions 265 (FIG. 2a) and which may also be used for covering any device areas in which respective buffer regions may not be desired. For example, as illustrated, a scribe line area 203 may be excluded from providing the stress buffer layer and hence this area may be covered by the deposition mask 202. Consequently, the deposition mask 202 may define corresponding openings 202C, 202D which are aligned to the openings 251C, 251D, wherein lateral dimensions of the openings 202C, 202D are selected to be significantly greater compared to the openings 251C, 251D in order to appropriately define the lateral size of the buffer regions 265 in FIG. 2a. The deposition mask 202 may be patterned on the basis of well-established lithography techniques.

Figure 2E:
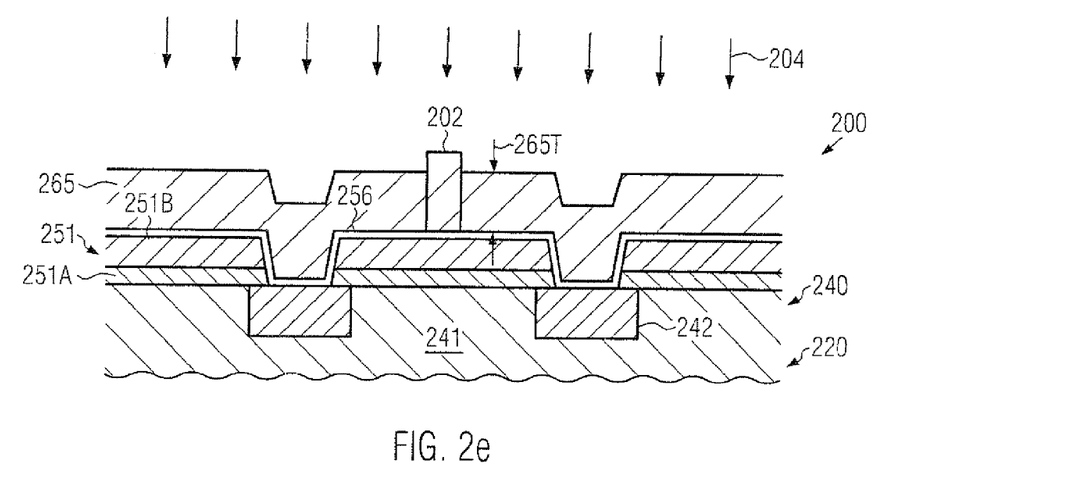

FIG. 2e schematically illustrates the semiconductor device 200 during a deposition process 204, such as an electrochemical deposition process, i.e., an electroplating process, an electroless process, or any combination thereof, in order to deposit a desired highly conductive metal, such as copper, silver and the like. As explained above, it may be advantageous to use a metal that may also be used in the metallization system 220, since the corresponding deposition tools and material resources are readily available. In one illustrative embodiment, a copper material may be deposited, thereby forming the buffer regions 265 with the desired lateral dimensions, as may be defined by the deposition mask 202. Furthermore, a thickness of the metal material and thus of the buffer regions 265 may be "thick," i.e., a thickness may be approximately 3 µm and greater. For example, in illustrative embodiments, the thickness 265T may be selected to be in a range of approximately 3-10 µm. Consequently, by providing an increased thickness above the last metallization layer 240, superior mechanical stability may be imparted to the metallization system 220 in view of any mechanical stress that may be introduced by the interaction between the chip and a package substrate still to be connected thereto. Furthermore, the moderately large metal volume provided by the buffer regions 265 may also provide superior heat dissipation capabilities, which may contribute to a less pronounced thermally induced mechanical stress. Furthermore, an enhanced shielding effect may be accomplished, for instance, in view of high energetic particles, such as cosmic rays, microwave radiation and the like. The deposition process 204 may be performed on the basis of any appropriate process recipe, as may also be applied during the formation of the metallization layers of the metallization system 220.

Figure 2F:
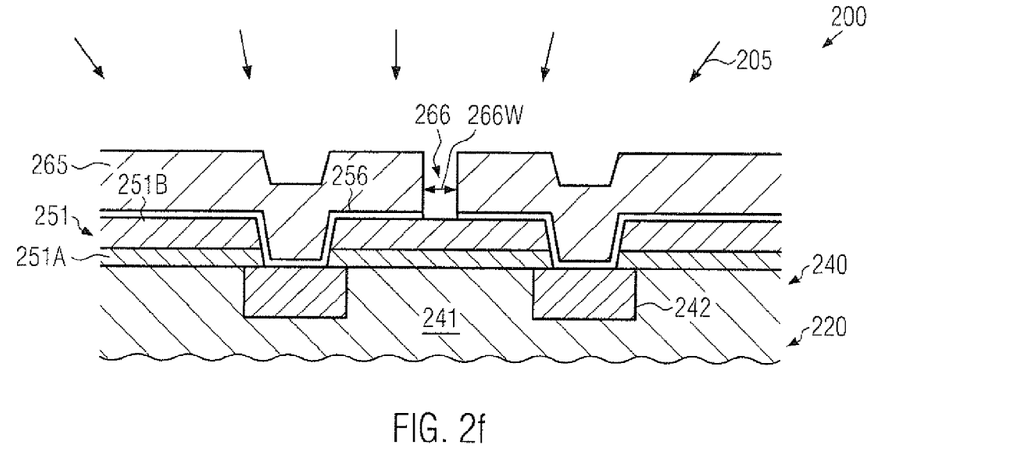

FIG. 2f schematically illustrates the semiconductor device 200 during a process sequence 205 for removing the deposition mask 202 (FIG. 2d) and also to remove an exposed portion of the conductive barrier layer 256. Consequently, the isolation trench 266 may be reliably formed between the buffer regions 265, wherein a width 266W may thus define the lateral offset between adjacent regions 265. For instance, the width 266W may be selected to be in the range of approximately 5 µm and less, such as 1 µm and less, thereby providing a high degree of coverage of the metallization system 220 by the buffer regions 265. The process sequence 205 may be performed on the basis of any appropriate process techniques, for instance by removing resist material on the basis of plasma assisted etch processes, wet chemical etch processes, followed by the removal of the exposed portion of the layer 256, which may be accomplished on the basis of sputter etch techniques, wet chemical etch processes and the like, depending on the composition of the layer 256. It should be appreciated that a certain degree of material erosion of the regions 265 may not be critical due to the moderately large thickness and lateral extension thereof.

Figure 2G:
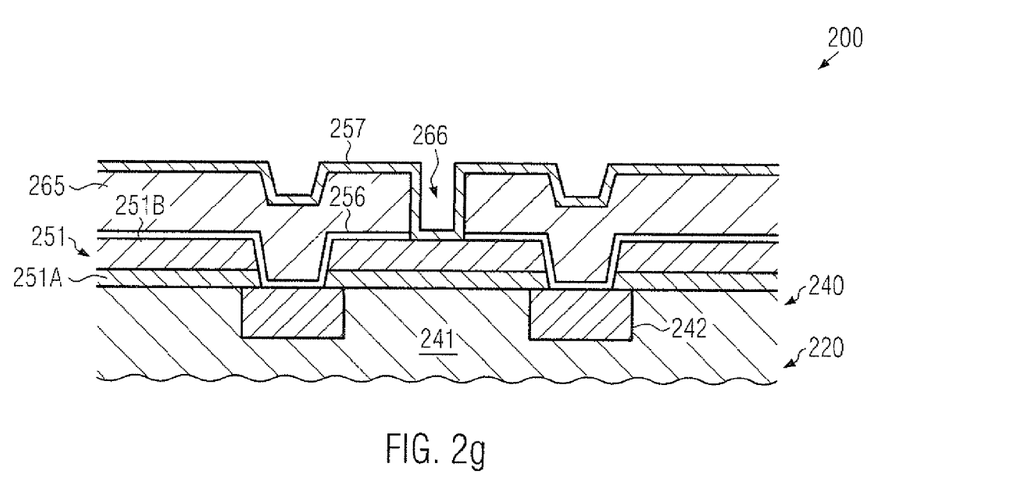

FIG. 2g schematically illustrates the semiconductor device 200 with a dielectric layer 257 formed on the buffer regions 265 and within the isolation trench 266, thereby providing reliable confinement of the material of the regions 265 and also providing reliable electrical insulation of the individual buffer regions 265. For instance, any appropriate dielectric material may be used, such as silicon nitride, which may be deposited on the basis of well-established deposition techniques, such as plasma enhanced chemical vapor deposition (CVD) and the like.

Figure 2H:
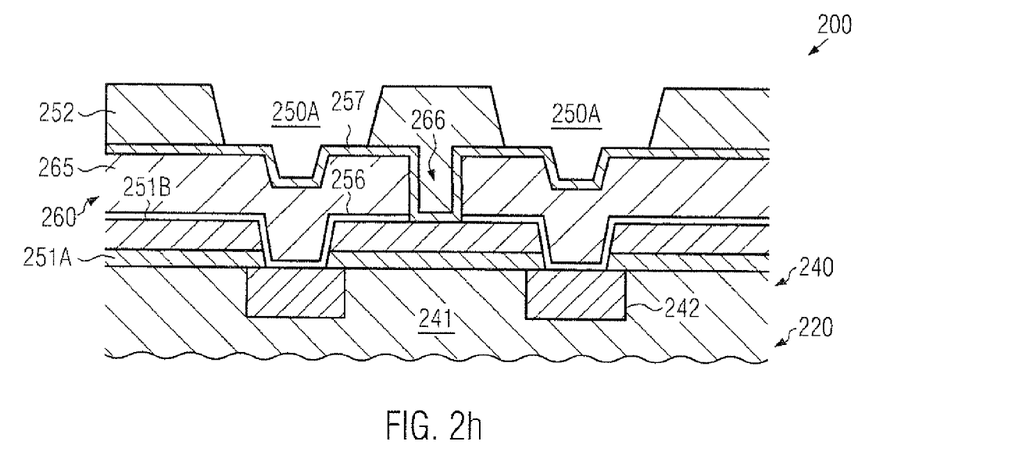

FIG. 2h schematically illustrates the semiconductor device 200 in a further advanced manufacturing stage in which a further dielectric material, such as polyimide 252, may be formed above the dielectric material 257 and within the isolation trench 266. Thus, the buffer regions 265 in combination with the dielectric materials provided within the isolation trench 266 may form the stress buffer layer 260 providing the desired mechanical characteristics. Furthermore, openings 250A may be formed so as to be aligned to the contact pads 242 with an appropriate lateral size, as may be required for forming bump structures, metal pillars and the like, in accordance with the overall layout as shown in FIG. 2a. The material 252 may be provided on the basis of any well-established process techniques and the patterning thereof may be accomplished by lithography based on process parameters as may typically be used in conventional process techniques. Thereafter, the material 252 may be used as an etch mask for exposing a portion of the buffer regions 265 within the openings 250A. For this purpose, any appropriate plasma assisted etch recipe, wet chemical etch recipe and the like may be applied.

Figure 2I:
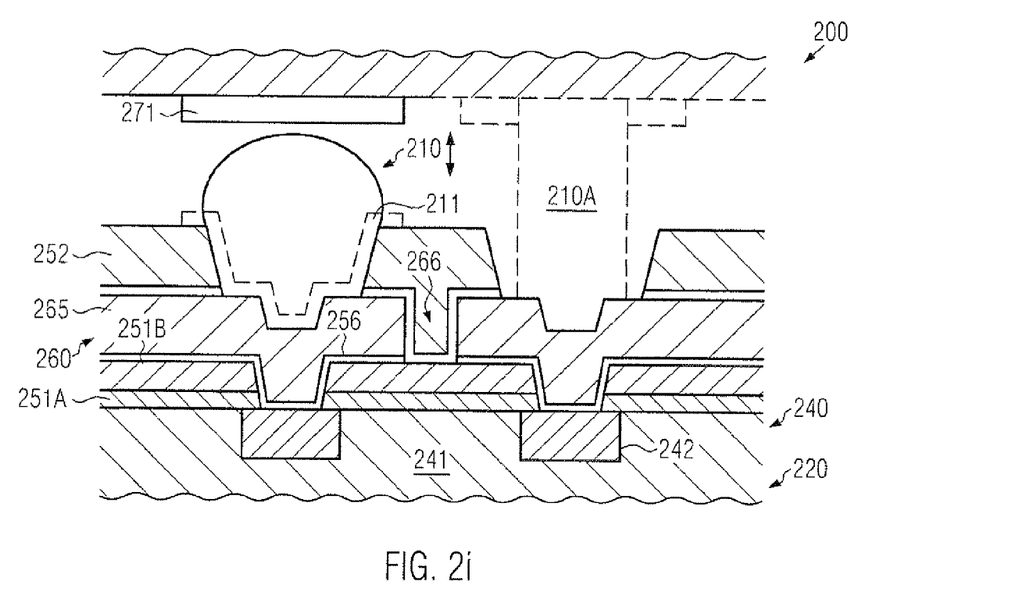

FIG. 2i schematically illustrates the semiconductor device 200 in a further advanced manufacturing stage in which the contact element 210 may be formed in the opening 250A, for instance in the form of a solder bump formed on the basis of a lead-free solder material, as previously explained. If required, an additional barrier material 211 may be provided between the contact element 210 and the buffer region 265 if direct contact is considered inappropriate. In this case, a similar process strategy may be applied as in conventional strategies by providing the material 211, forming a deposition mask, depositing material of the contact element 210, removing the deposition mask and patterning the material 211. In other illustrative embodiments, as indicated by the element 210A in dashed lines, a metal pillar may be provided, such as a copper pillar, which may be directly formed on the region 265 by applying an appropriate deposition mask, possibly in combination with a copper-based seed layer, if required. Thus, a plurality of well-established process techniques may be applied to provide the contact elements 210, 210A. Furthermore, a package substrate 270 may be provided with an appropriate layout of contact pads 271, which may be brought into contact with the elements 210, 210A in accordance with well-established bond techniques. It should be appreciated that the contact pads 271 may have any appropriate configuration, for instance, a solder material, a copper material and the like, may be provided so as to form an intermetallic connection with the contact element 210.

As a result, the present disclosure provides semiconductor devices and manufacturing techniques in which a contact structure may be provided on the basis of lead-free materials with superior stress distributing characteristics by providing a stress buffer layer including a plurality of buffer regions of increased lateral size and with a thickness in the range of approximately 3-10 μm. Hence, any mechanical stress induced during the connection of a semiconductor chip and a package substrate and thereafter during the operation of the composite semiconductor device may be efficiently distributed across a large surface area. Consequently, significant modifications, for instance, reduction of the amount of sensitive low-k dielectric materials, as may typically be required in conventional strategies, may be avoided, thereby providing superior performance of the metallization system. Furthermore, the pronounced coverage of the metallization system by the buffer regions may provide superior thermal and shielding characteristics which may allow an efficient use in critical environments.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
a metallization system positioned above a substrate, said metallization system comprising a plurality of metallization layers, at least some of said metallization layers comprising a low-k dielectric material;
a copper-containing contact pad positioned in a last metallization layer of said metallization system, wherein an upper surface of said copper-containing contact pad is substantially co-planar with an upper surface of said last metallization layer;
a passivation layer positioned above said last metallization layer, said passivation layer covering a portion of said upper surface of said copper-containing contact pad;
a stress buffer layer positioned above said passivation layer, said stress buffer layer comprising a copper-containing buffer region having a contact portion that is embedded in said passivation layer and connects to said copper-containing contact pad;
a lead-free contact element positioned on a portion of said copper-containing buffer region, wherein a portion of said lead free contact element is embedded in said copper-containing buffer region and a lateral width of said buffer region is greater than a lateral width of said lead-free contact element; and
a package substrate connected to said metallization system via said lead-free contact element.

2. The semiconductor device of claim 1, wherein a thickness of said copper-containing buffer region is approximately 3 μm or more.

3. The semiconductor of claim 1, wherein said lead-free contact element comprises a lead-free solder material.

4. The semiconductor of claim 1, wherein said lead-free contact element comprises a copper pillar extending from said copper-containing buffer region.

5. The semiconductor device of claim 1, wherein said copper-containing buffer region comprises a conductive barrier layer that is in direct contact with a second portion of said upper surface of said copper-containing contact pad and covers upper and sidewall surfaces of said passivation layer.

6. The semiconductor device of claim 1, wherein said stress buffer layer comprises a plurality of copper-containing buffer regions, and wherein a lateral offset between adjacent copper-containing buffer regions is approximately 5 μm or less.

7. The semiconductor device of claim 1, wherein said lateral offset is approximately 1 μm or less.

8. The semiconductor device of claim 1, wherein a lateral size of said copper-containing buffer region is at least twice a lateral size of said contact pad.

9. The semiconductor device of claim 1, wherein said stress buffer layer further comprises a dielectric material that covers and laterally encloses said copper-containing buffer region, wherein said dielectric material comprises silicon nitride.

10. The semiconductor device of claim 9, wherein said dielectric material comprises a conformal material layer covering sidewall and upper surfaces of said copper-containing buffer region and an isolation material layer covering said conformal material layer.

11. The semiconductor device of claim 10, wherein said conformal material layer and said isolation material layer each directly contact a sidewall surface portion of said lead-free contact element.

12. The semiconductor device of claim 1, wherein said buffer region comprises a contact portion extending through said passivation layer and contacting said contact pad, where said lateral width of said buffer region is at least twice a lateral width of said contact portion.

13. A semiconductor device, comprising:
a metallization system positioned above a substrate, said metallization system comprising a plurality of metallization layers, at least some of said metallization layers comprising a low-k dielectric material;

a passivation layer positioned above a last metallization layer of said metallization system, said last metallization layer comprising a plurality of contact pads, wherein an upper surface of each of said plurality of contact pads is substantially co-planar with an upper surface of said last metallization layer;

a stress buffer layer positioned above said passivation layer, said stress buffer layer comprising a plurality of stress buffer regions and a dielectric material positioned above each of said plurality of stress buffer regions, each of said plurality of stress buffer regions comprising a contact portion extending through said passivation layer and conductively contacting a respective one of said plurality of contact pads; and a plurality of contact elements positioned in and above said dielectric material, each of said plurality of contact elements extending through said dielectric material and conductively contacting a respective one of said plurality of stress buffer regions, wherein a portion of each of said plurality of contact elements is embedded in said respective one of said plurality of stress buffer regions, and wherein a lateral width of at least one of said plurality of contact elements is less than a lateral width of said respective one of said plurality of stress buffer regions conductively connected thereto.

14. The semiconductor device of claim 13, wherein a surface area of at least one of said plurality of stress buffer regions is at least twice a surface area of said respective one of said plurality of contact elements conductively connected thereto.

15. The semiconductor device of claim 13, wherein at least one of said plurality of contact pads, said plurality of stress buffer regions, and said plurality of contact elements comprises copper.

16. The semiconductor device of claim 13, wherein said dielectric material comprises a dielectric isolation material that extends between and laterally isolates each of said plurality of stress buffer regions from adjacent ones of said plurality of stress buffer regions.

17. The semiconductor device of claim 16, wherein a lateral offset between at least an adjacent two of said plurality of stress buffer regions is approximately 5 µm or less.

18. The semiconductor device of claim 16, wherein a lateral offset between at least an adjacent two of said plurality of stress buffer regions is approximately 1 µm or less.

19. The semiconductor device of claim 13, wherein said contact element comprises a lead-free solder material.

20. The semiconductor device of claim 13, wherein said lateral width of said stress buffer regions is at least twice a lateral width of said contact pad.

21. The semiconductor device of claim 13, wherein said dielectric material comprises a conformal material layer that is positioned between said dielectric isolation material and each of said plurality of stress buffer regions and covers upper and sidewall surface portions of each of said plurality of stress buffer regions.

22. The semiconductor device of claim 13, wherein said dielectric material directly contacts sidewall surface portions of each of said plurality of contact elements.

* * * * *